United States Patent
Osada et al.

(10) Patent No.: US 7,609,544 B2
(45) Date of Patent: Oct. 27, 2009

(54) PROGRAMMABLE SEMICONDUCTOR MEMORY DEVICE

(75) Inventors: Kenichi Osada, Tokyo (JP); Takayuki Kawahara, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 154 days.

(21) Appl. No.: 11/283,689

(22) Filed: Nov. 22, 2005

(65) Prior Publication Data

US 2006/0126380 A1 Jun. 15, 2006

(30) Foreign Application Priority Data

Nov. 26, 2004 (JP) .............................. 2004-341475

(51) Int. Cl.
 *G11C 11/00* (2006.01)
(52) U.S. Cl. .................................. 365/163; 365/189.16
(58) Field of Classification Search ................. 365/163, 365/185.22, 148, 189.16
 See application file for complete search history.

(56) References Cited

U.S. PATENT DOCUMENTS

| 6,625,054 | B2 |  | 9/2003 | Lowrey et al. | ............... | 365/148 |
| 6,813,177 | B2 | * | 11/2004 | Lowrey et al. | ............... | 365/148 |
| 2003/0185047 | A1 | * | 10/2003 | Khouri et al. | ................ | 365/163 |
| 2004/0114429 | A1 | * | 6/2004 | Ehiro et al. | .................. | 365/158 |
| 2004/0228163 | A1 | * | 11/2004 | Khouri et al. | ................ | 365/154 |
| 2005/0036364 | A1 | * | 2/2005 | Ha et al. | ...................... | 365/163 |
| 2006/0091373 | A1 | * | 5/2006 | Lee et al. | ........................ | 257/2 |
| 2007/0025144 | A1 | * | 2/2007 | Hsu et al. | .................... | 365/163 |

FOREIGN PATENT DOCUMENTS

JP 2003-100084 A 4/2003

OTHER PUBLICATIONS

M. Gill et al., "Ovonic Unified Memory—A High Performance Nonvolatile Memory Technology for Stand-Alone Memory and Embedded Applications," *IEEE International Solid-State Circuits Conference, Digest of Technical Papers*, U.S., 2002, pp. 202-203.
A. Pirovano et al:, "Electronic Switching Effect in Phase-Change Memory Cells," *IEEE International Electron Devices Meeting, Technical Digest*, U.S., 2002, pp. 923-926.
Y.N. Hwang et al., "Completely CMOS-Compatible Phase-Change Nonvolatile RAM Using NMOS Cell Transistors," *Non-Volatile Semiconductor Memory Workshop, Digest of Technical Papers*, U.S., 2003, pp. 91-92.

* cited by examiner

*Primary Examiner*—J. H. Hur
*Assistant Examiner*—Douglas King
(74) *Attorney, Agent, or Firm*—Miles & Stockbridge P.C.

(57) ABSTRACT

The present invention provides a technology which can suppress a variation in a value after a write operation to minimum so as to facilitate multi-bit operation in a semiconductor device such as a phase change memory. A semiconductor device includes: a memory cell having a storage element (phase change material) that stores information depending on a state change by temperature; an I/O circuit; and means which, when writing data, performs a set operation and an operation for writing desired data, measures a resistance value of the storage element by means of a verify operation, and when the resistance value is not within a target range, performs the set operation and the write operation again while changing a voltage to be applied to the storage element.

4 Claims, 12 Drawing Sheets

PROGRAMMABLE SEMICONDUCTOR MEMORY DEVICE

CROSS-REFERENCE TO RELATED APPLICATION

The present application claims priority from Japanese Patent Application No. JP 2004-341475 filed on Nov. 26, 2004, the content of which is hereby incorporated by reference into this application.

TECHNICAL FIELD OF THE INVENTION

The present invention relates to a semiconductor device. More particularly, it relates to an on-chip memory, which is mounted on a non-volatile memory and a system LSI (microcomputer and the like).

BACKGROUND OF THE INVENTION

As a technology in the field of the non-volatile memories and on-chip memories examined by the inventors of the present invention, for example, the following technologies are known.

In order to attain high-speed and highly-integrated non-volatile memories, phase change memories are being developed. The phase change memories are disclosed in Japanese Patent Application Laid-Open Publication No. 2003-100084 (Patent Document 1), the specification of U.S. Pat. No. 6,625, 054 (Patent Document 2), "IEEE International Solid-State Circuits Conference, Digest of Technical Papers)", U.S., 2002, pp. 202-203 (Non-patent Document 1), "IEEE International Electron Devices Meeting, Technical Digest" U.S., 2002, pp. 923-926 (Non-patent Document 2), and "Non-Volatile Semiconductor Memory Workshop, Digest of Technical Papers)", U.S., 2003, pp. 91-92 (Non-patent Document 3). As described in Non-patent Document 1, for example, in a phase change memory, information is stored by utilizing that resistance of a phase change material called chalcogenide varies depending on the state thereof. The rewriting of the phase change resistor is performed by changing the state of the phase change resistor in such a manner that an electric current is allowed to flow so as to generate a heat. The resistance increase (change into amorphous (non-crystalline) state) which is also called also as a reset operation (RESET) is performed in a state where a comparatively high temperature is maintained, and the resistance decrease (change into crystalline state) which is also called as a set operation (SET) is performed in a state where a comparatively low temperature is maintained for a sufficient period. A read operation for the phase change material is performed in such a manner that an electric current is allowed to flow within a range that does not change the state of the phase change resistor.

Non-patent Document 2 and Patent Document 1 describe the characteristics of the phase change resistor. Further, Non-patent Document 3 describes a memory cell, which is composed of phase change resistor and an n channel MOS (Metal Oxide Semiconductor) transistor. Patent Document 2 describes multi-bit operation of a phase change memory.

These documents describe not only a high-speed ROM (Read-Only Memory) but also possibility of a non-volatile RAM (Random Access Memory), and they also mention the realization of a unified memory having the functions of both ROM and RAM. Since the phase of the phase change resistor can be changed by a lower electric power in the phase change memory having smaller electrode area of the phase change resistor, scaling is facilitated. Further, since the phase change resistor changes greatly, a high-speed read operation can be realized. Also, the multi-bit operation is possible and thus high integration can be realized. For these reasons, the realization of a high-speed non-volatile memory by the phase change memory is expected.

SUMMARY OF THE INVENTION

As a result of the examinations for the technologies of the phase change memories by the inventors of the present invention, the following becomes apparent.

In order to realize the high integration of phase change materials in the present invention, the inventors have examined a multi-bit method. Since the phase change material stores data depending on the values of resistance, it is necessary to suppress a variation range of the resistance value after writing to minimum for multi-bit operation. For its achievement, a verify operation for checking a written value after the write operation is important. When the resistance value deviates from a target range according to the verify operation, the write operation should be performed again after the conditions are changed, but the resistance value before the first write operation is different from the resistance value before the rewrite operation. Since the write operation is influenced by the resistance value before the write operation, it is very difficult to determine a writing condition for obtaining a desired resistance value by the rewrite operation.

Therefore, an object of the present invention to provide a technology capable of suppressing a variation in a value after a write operation to minimum so as to facilitate multi-bit operation in a semiconductor device such as a phase change memory.

The above and other objects and novel characteristics of the present invention will be apparent from the description of this specification and the accompanying drawings.

The typical ones of the inventions disclosed in this application will be briefly described as follows.

That is, a semiconductor device according to the present invention is characterized by comprising a plurality of memory cells, each of which includes a storage element that stores data therein and a field-effect transistor that is connected to the storage element, wherein the semiconductor device further comprises means which applies a first voltage to the storage element and then applies a second voltage which depends on write data so as to perform a write operation, checks a value written into the storage element, and when the value is not within a desired range, applies the first voltage to the storage element and then applies a third voltage so as to perform the write operation again.

Further, a semiconductor device according to the present invention is characterized by comprising a plurality of memory cells, each of which includes a storage element that stores data therein and a field-effect transistor that is connected to the storage element, wherein the semiconductor device further comprises means which applies a first voltage to the storage element and then applies a second voltage which depends on write data for a first time so as to perform a write operation, checks a value written into the storage element, and when the value is not within a desired range, applies the first voltage to the storage element and then applies the second voltage for a second time so as to perform the write operation again.

Also, a semiconductor device according to the present invention is characterized by comprising a plurality of memory cells, each of which includes a storage element that stores data therein and a field-effect transistor that is connected to the storage element, wherein the semiconductor device further comprises means which applies a first voltage to the storage element and then applies a second voltage so as to perform a write operation while setting the second voltage to a ground potential over a first time which depends on write data, checks a value written into the storage element, and when the value is not within a desired range, applies the first voltage to the storage element and then applies the second voltage so as to perform the write operation again while setting the second voltage to the ground potential over a second time.

According to the present invention, the semiconductor device with high reliability can be realized.

BRIEF DESCRIPTIONS OF THE DRAWINGS

DESCRIPTIONS OF THE PREFERRED EMBODIMENTS

Figure 1:
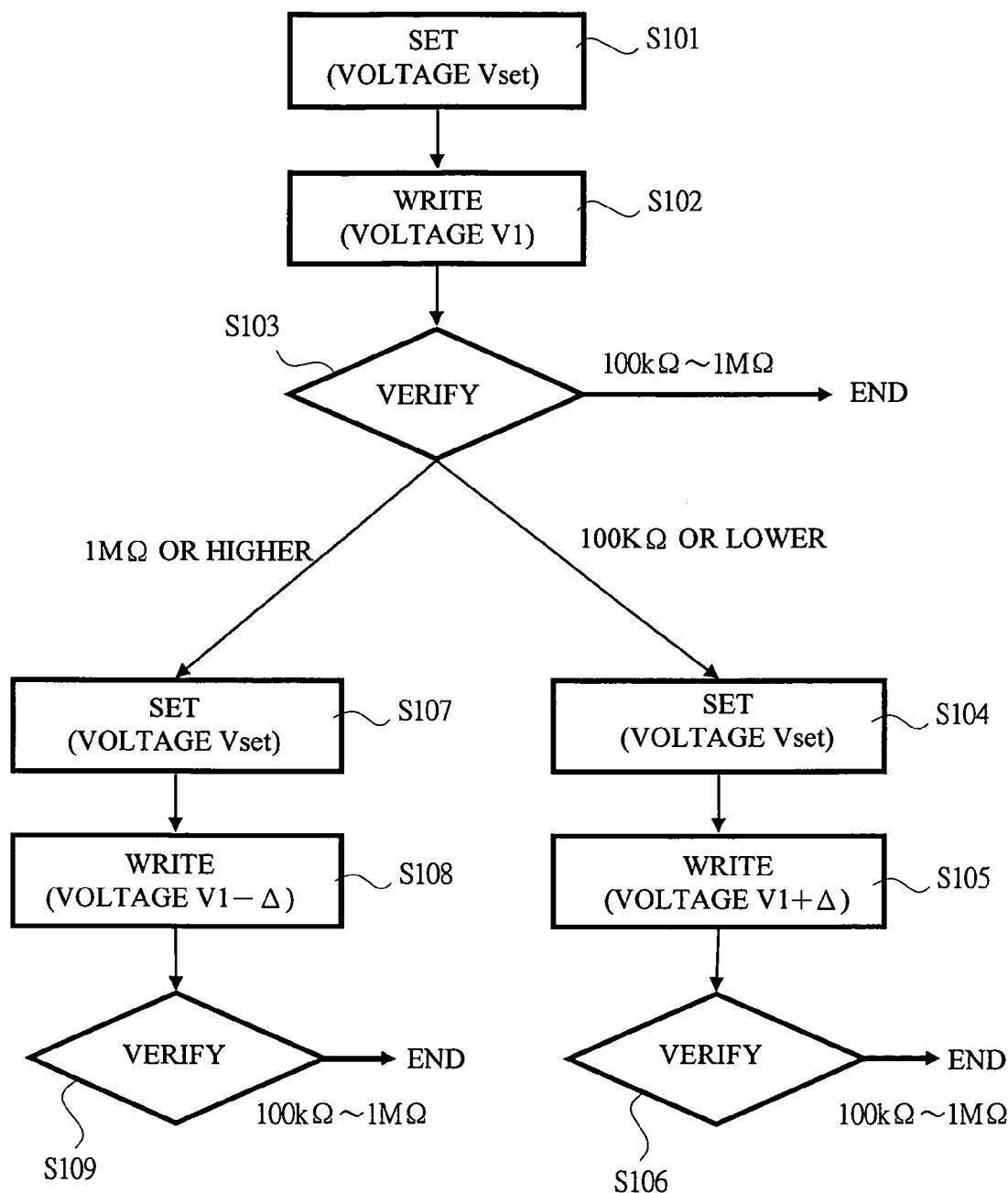
FIG. 1 is a diagram illustrating a write method of a semiconductor device according to one embodiment of the present invention.

Hereinafter, embodiments of the present invention will be described in detail with reference to the accompanying drawings. Note that components having the same function are denoted by the same reference symbols throughout the drawings for describing the embodiment, and the repetitive description thereof will be omitted. A symbol representing the name of a terminal is used also as a name of a wiring and a signal, and a symbol representing the name of a power supply is used also as a voltage value thereof unless otherwise specified.

Circuit components which compose respective function blocks in the embodiments are not particularly limited, but are formed on one semiconductor substrate such as that made of single crystal silicon by a publicly-known semiconductor integrated circuit technology such as CMOS (complementary MOS transistor). In the drawings, the connection of substrate potentials of the MOS transistors is not particularly shown, but a connecting method is not particularly limited as long as the MOS transistors can operate normally. Further, a low level of a signal is described as "L", and a high level is described as "H" unless otherwise specified.

(Multi-bit-write Method)

FIG. 1 is a diagram illustrating a multi-bit-write method for a phase change material according to one embodiment of the present invention.

The multi-bit means three values or more, and for example, data "0" (set state) indicates that resistance of an element is 10 kΩ or lower, data "1" indicates that the resistance is 100 kΩ to 1 MΩ (incomplete reset state), and data "2" indicates that the resistance is 10 MΩ or more (complete reset state). FIG. 1 shows the case where data "1" is written. When the data "1" is written into a storage element, a voltage Vset (first voltage) is applied to the storage element to perform the set operation (writing of data "0") at step S101, and then, a voltage V1 (second voltage) is applied to the element to write the data "1" at step S102. Thereafter, a resistance value of the element is checked and measured by a verify operation at step S103, and when the resistance value is within a target range of 100 kΩ to 1 MΩ, the write operation is ended.

On the other hand, when the resistance value of the element is 100 kΩ or less, the voltage Vset (first voltage) is applied to the element so as to perform the set operation again at step S104, and a write voltage V1+Δ (third voltage) higher than the voltage V1 is applied to the element so as to perform rewrite operation at step S105. Thereafter, the resistance value of the element is checked and measured by the verify operation at step S106, and when the resistance value is within the target range of 100 kΩ to 1 MΩ, the write operation is ended. When the resistance value of the element is still 100 kΩ data or less, the rewrite operation is performed again after the write voltage is further increased, or it is considered as a write error.

When the resistance value is 1 MΩ or more in the verify operation at step S103, after the voltage Vset (first voltage) is applied to the element to perform the set operation again at step S107, a write voltage (third voltage) V1−Δ lower than the voltage V1 is applied to the element to perform the write operation again at step S108. Thereafter, the resistance value of the element is checked and measured by the verify operation at step S109, and when the resistance value is in the range of 100 kΩ to 1 MΩ, the write operation is ended. When the resistance value of the element is still 1 MΩ or more, the write operation is performed again after the write voltage is further reduced.

(Configuration of Memory Array)

Figure 2:
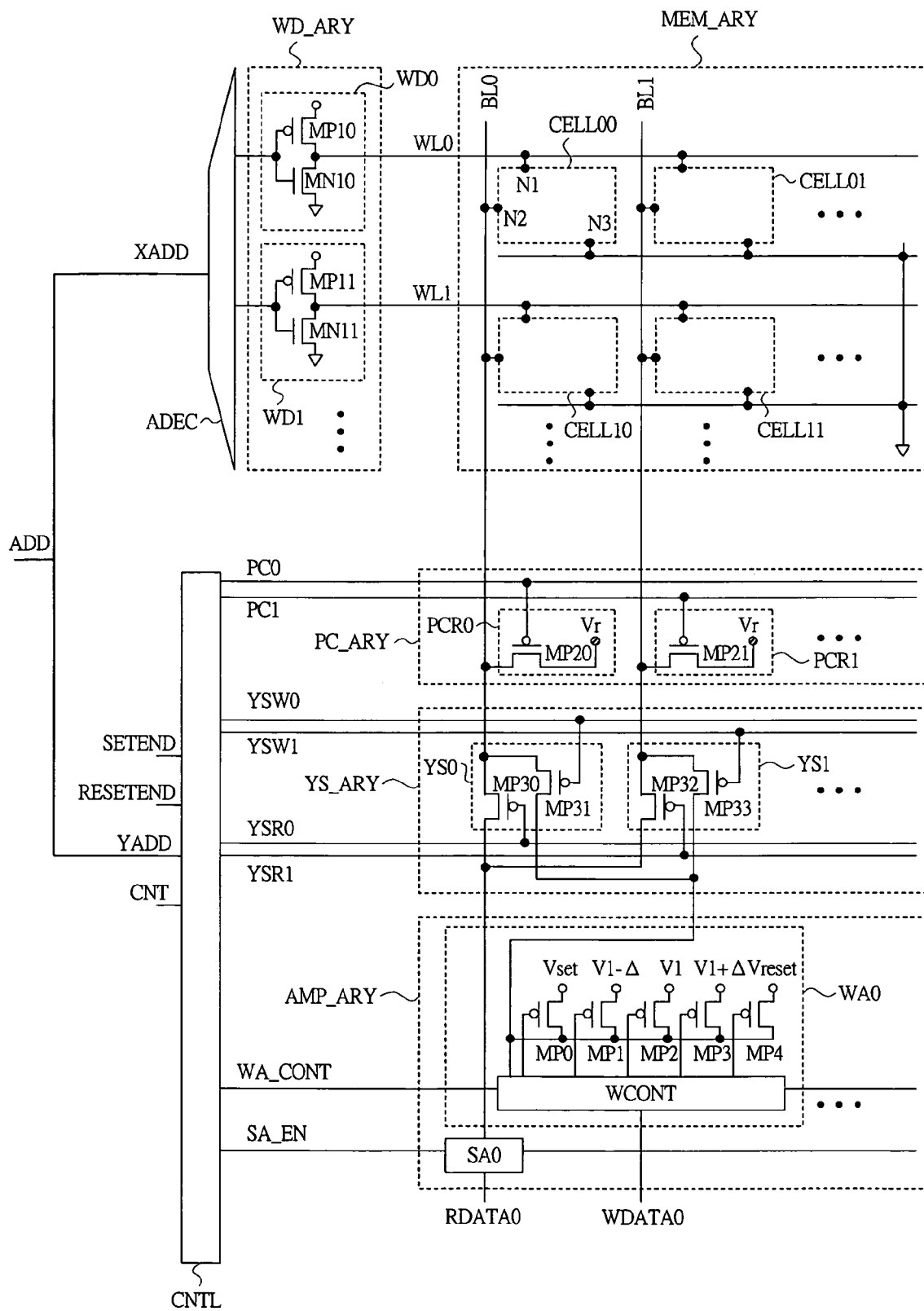
FIG. 2 is a circuit diagram illustrating a configuration of the semiconductor device according to one embodiment of the present invention.

One example of a configuration of the semiconductor device according to this embodiment will be described below with reference to FIG. 2. FIG. 2 is a circuit diagram illustrating a memory array configuration of the semiconductor device according to one embodiment of the present invention.

This memory array is mounted as an on-chip memory on a microcontroller or on a single non-volatile memory. The memory array MEM_ARY is composed of a plurality of word lines WL, a plurality of bit lines BL and a plurality of memory cells CELL. The memory cells CELL are disposed and connected at intersection points between the word lines WL and the bit lines BL. In each memory cell CELL, as illustrated by the memory cell CELL00, a node N1 is connected to the word line WL, a node N2 is connected to the bit line BL, and a node N3 is connected to a ground potential.

Figure 3A:
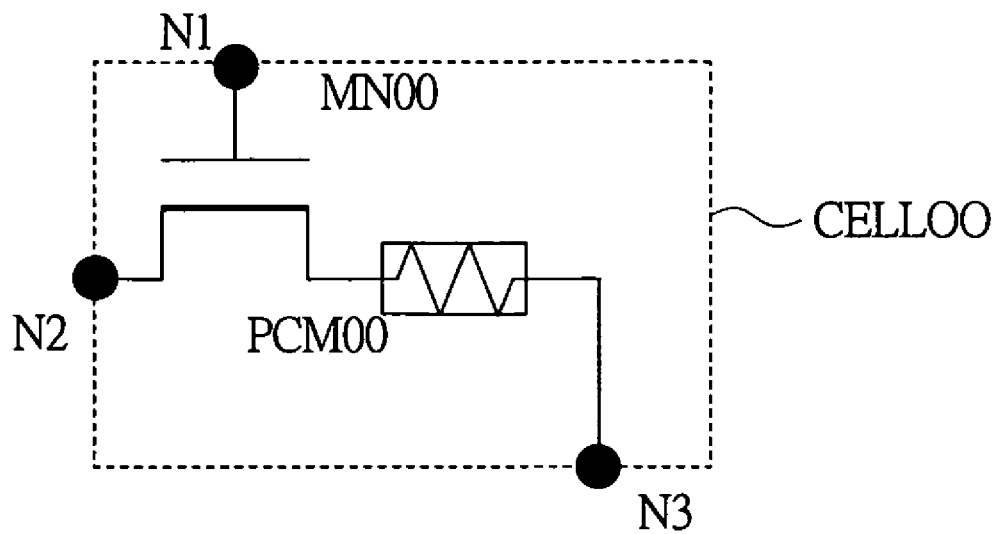
FIG. 3A is a circuit diagram illustrating a configuration of a memory cell to be used in a memory array in FIG. 2.
Figure 3B:
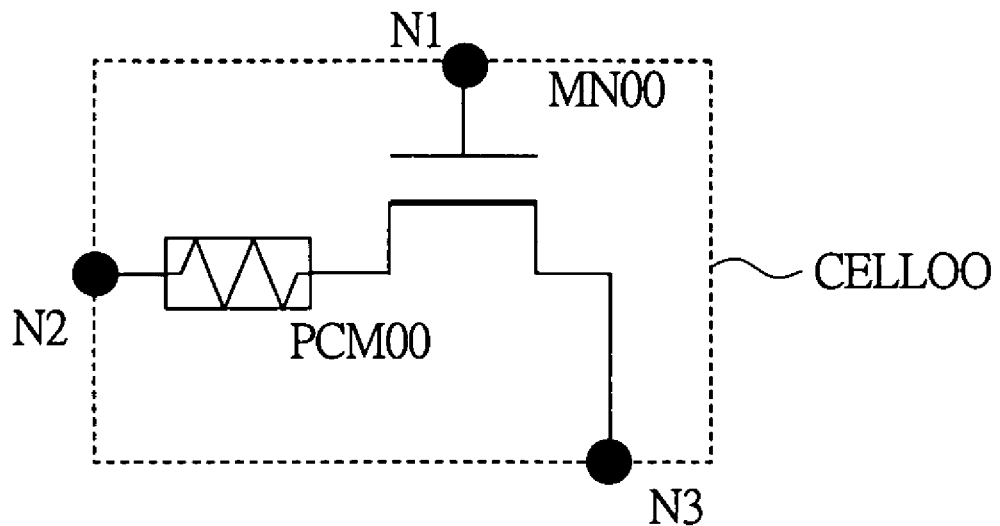
FIG. 3B is a circuit diagram illustrating a configuration of a memory cell to be used in a memory array in FIG. 2.

FIG. 3A and FIG. 3B show the details of each memory cell CELL. Each memory cell CELL is composed of an n channel MOS transistor MN00 and a storage element PCM00.

The storage element PCM00 is, for example, the element which is called as a phase change material and is characterized in that the resistance thereof is a low value of about 10 kΩ in a crystalline state and is a high value of about 10 MΩ or more in an amorphous state. When the amorphous state and the crystalline state are mixed, continuous resistance values ranging from 10 kΩ to 10 MΩ can be realized. The storage element PCM00 can change its state by the temperature of the storage element itself. Concretely, when the storage element is melted by high temperature and is rapidly cooled, the amorphous state is obtained, and when low temperature is maintained for a comparatively long time, the crystalline state is obtained. Furthermore, when an intermediate temperature is provided, the storage element can be partially amorphous. The temperature of the storage element can be changed by changing an electric current which is allowed to flow in the storage element PCM00 and the time for which the current flows.

A gate electrode of the n channel MOS transistor MN00 is connected to the word line WL via the node N1. When the memory cell CELL00 is selected, the n channel MOS transistor MN00 is controlled to be in an ON state, and when not selected, it is controlled to be in an OFF state.

The memory cell according to this embodiment reads information in accordance with the resistance value of the storage element PCM00, namely, the value of the electric current flowing in the bit line BL and the source line (line connected to the node N3). As shown in FIG. 3A, therefore, one terminal of the phase change material PCM00 may be connected to the ground potential via the node N3, or as shown in FIG. 3B, one terminal of PCM00 may be connected to the bit line BL via the node N2. In this embodiment, the memory cell shown in FIG. 3B will be described as an example unless otherwise specified.

As shown in FIG. 2, the word line WL is connected to a word driver circuit WD. The word driver circuits WD are arranged in a row so as to form a word driver array WD_ARY. For example, the word driver circuit WD0 is composed of an n channel MOS transistor MN10 and a p channel MOS transistor MP10, and a decoder ADEC selects one word line WL. An address XADD is inputted into the decoder ADEC.

The bit line BL is connected to a pre-charge circuit for read operation PCR. The pre-charge circuits for read operation PCR are arranged in a line, and compose a pre-charge circuit array PC_ARY. Concretely, for example, the pre-charge circuit PCR0 is composed of a p channel MOS transistor MP20, in which a drain electrode is connected to the bit line BL0, a gate electrode is connected to a control signal line PC0, and a source electrode is connected to a power supply potential line for read operation Vr. The pre-charge circuits for read operation PCR are alternately connected to the control signal line PC0 and PC1.

Further, the bit lines BL are connected to column selection circuits YS. The column selection circuits YS are arranged in a line, and compose a column selection circuit array YS_ARY. Concretely, for example, the column section circuit YS0 is composed of p channel MOS transistors MP30 and MP31. A drain electrode of the p channel MOS transistor MP30 is connected to the bit line BL0, a gate electrode is connected to a control signal line YSR0, and a source electrode is connected to a sense amplifier circuit SA0. Also, a drain electrode of the p channel MOS transistor MP31 is connected to a bit line BL0, a gate electrode is connected to a control signal line YSW0, and a source electrode is connected to a write amplifier circuit WA0. The column selection circuits YS are alternately connected to the control signal lines YSR0 and YSR1 and YSW0 and YSW1.

Therefore, the bit lines BL with which reading or writing is performed in parallel are controlled alternately. More specifically, a memory cell which is adjacent to the memory cell where the read or write operation is performed is always in a non-selected state. As a result, since heat is generated from every other memory cells, the local heat generation can be prevented, and thus a stable operation of a semiconductor integrated circuit can be improved.

The sense amplifier circuit SA amplifies data by means of an activation signal SA_EN, and outputs the amplified data to a data bus RDATA. The write amplifier circuit WA is composed of a control circuit WCONT for supplying a suitable voltage to the bit lines BL by means of a data bus WDATA and a control signal WA_CONT, and p channel MOS transistors MP0, MP1, MP2, MP3 and MP4. The sense amplifier circuits SA and the write amplifier circuits WA are arranged in lines so as to form an amplifier array AMP_ARY. A gate electrode of the p channel MOS transistor MP0 is controlled by the control circuit WCONT, a source electrode is connected to the power supply line Vset, and a drain electrode is selectively connected to the bit line BL via the column selection circuit YS. A gate electrode of the p channel MOS transistor MP1 is controlled by the control circuit WCONT, a source electrode is connected to the power supply line V1−Δ, and a drain electrode is selectively connected to the bit line BL via the column selection circuit YS. A gate electrode of the p channel MOS transistor MP2 is controlled by the control circuit WCONT, a source electrode is connected to the power supply line V1, and a drain electrode is selectively connected to the bit line BL via the column selection circuit YS. A gate electrode of the p channel MOS transistor MP3 is controlled by the control circuit WCONT, a source electrode is connected to the power supply line V1+Δ, and a drain electrode is selectively connected to the bit line BL via the column selection circuit YS. A gate electrode of the p channel MOS transistor MP4 is controlled by the control circuit WCONT, a source electrode is connected to the power supply line Vreset, and a drain electrode is selectively connected to the bit line BL via the column selection circuit YS.

The control circuit CNTL receives control signals SETEND, RESETEND, YADD and CNT from outside of the memory array, and generates and outputs control signals PC, YSR, YSW, WA_CONT, SA_EN.

(Operation Method)

Figure 4:
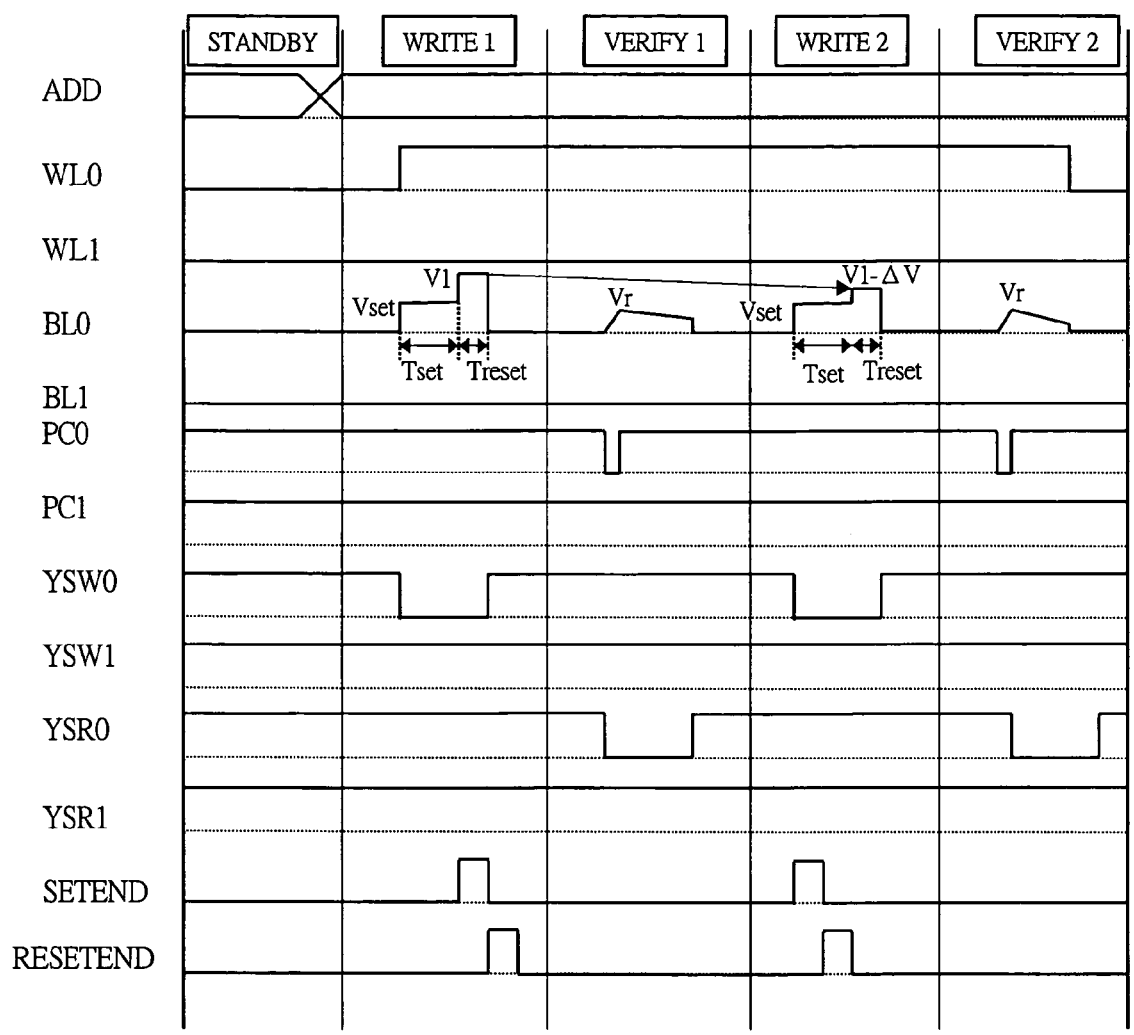
FIG. 4 is a waveform chart illustrating an operation of the semiconductor device shown in FIG. 2.

A detailed operation of the semiconductor device according to this embodiment will be described below with reference to FIG. 4. FIG. 4 is an operation waveform chart of the memory array shown in FIG. 2. This embodiment describes the case where the data "1" is written into the memory cell CELL00. The data "1" indicates that, for example, the resistance value of the phase change material is set to 100 kΩ to 1 MΩ.

At first, in a standby state STANDBY, a write operation WRITE1 is performed. When the write operation WRITE1 is started, an address ADD and write data WDATA0 are inputted. The address ADD is divided into an X-system address XADD to be inputted into the decoder ADEC and a Y-system address YADD to be inputted into the control circuit CNTL. The X-system address is decoded by the decoder ADEC, and one selected word line WL transits from 'L' to 'H'. In this embodiment, the word line WL0 is selected. The Y-system address YADD is decoded by the control circuit CNTL so as to be control signals YSW and YSR for selecting a column.

The write data WDATA0 is selectively inputted into the bit line BL by the control signals YSW0 and YSW1. In this embodiment, the control signal YSW0 is activated (YSW0='L'), and the voltage of the bit line BL0 is controlled in accordance with the write data WDATA0. As to an electric potential of the bit line BL0, the voltage Vset (first voltage) is firstly inputted into the bit line BL0 for the time Tset (step S101) The voltage Vset is a voltage for setting, and is, for example, 1 V. Tset is a set time, and is, for example, 1 microsecond. After the end of setting, the bit line BL0 is immediately set to the voltage V1 (second voltage), and it is maintained for a time Treset (step S102). The voltage V1 is the voltage for setting the resistance value to 100 kΩ to 1 MΩ, and is, for example, 2 V. After the voltage is maintained for the time Treset, the voltage of the bit line BL0 is rapidly reduced to 0 V so that the phase change material PCM00 of the memory cell CELL00 is rapidly cooled, and a melted portion is transformed into an amorphous state. Since the phase change material PCM00 is not completely melted by the voltage V1, a crystalline portion which is the set state and an amorphous portion which is the reset state coexist, and the resistance value becomes 100 kΩ to 1 MΩ. Note that the control signal SETEND is a signal for informing the elapse of the set time Tset, and the control signal RESETEND is a signal for informing the elapse of the reset time Treset.

Subsequently, the verify operation VERIFY1 for checking whether the write operation is performed properly (step S103) will be described below.

The pre-charge control signal PC0 is changed from "H" into "L" to precharge the bit line BL0 to a voltage for read operation Vr. Thereafter, the control signal PC0 is changed from "L" into "H", and an electric current is allowed to flow from the bit line BL0 to the ground potential by the memory cell CELL00. The voltage of the bit line is transmitted to the sense amplifier SA0 by activating the control signal YSR0, and is then amplified to be sent to the data bus RDATA0. When the resistance value is 100 kΩ to 1 MΩ, since there is no problem, and the write operation is ended.

When the resistance is 100 kΩ or lower or 1 MΩ or higher, the write operation is performed again. This embodiment describes the case where the resistance is 1 MΩ or higher.

This subsequent write operation is performed in a cycle WRITE 2. As to the electric potential of the bit line BL0, the voltage Vset is inputted again for the time Tset (step S107). After the setting is ended, the voltage (third voltage) V1−Δ is set to the bit line BL0, and it is maintained for the time Treset (step S108). The voltage V1−Δ is lower than the voltage V1, namely, 1.8 V, for example. After the voltage V1−Δ is maintained for the time Treset, the voltage is rapidly reduced to 0 V so that the phase change material PCM00 of the memory cell CELL00 is rapidly cooled and the melted portion is transformed into an amorphous state. In comparison with the case of the voltage V1, since a melting volume becomes smaller in the case of the voltage V1−Δ, the amorphous portion which is the reset state is reduced, and the resistance value of the phase change material PCM00 is reduced.

Subsequently, a verify operation VERIFY2 for checking whether the write operation is performed properly is performed (step S109). This operation is the same operation as VERIFY1. As a result, when the resistance value is 100 kΩ to 1 MΩ, the write operation is ended without a problem. If the resistance is still high, the similar write operation with lower voltage is required again.

When the resistance value written in the write operation WRITE1 is than 100 kΩ or less, the write operation is performed again by using the voltage V1+Δ which is higher than V1 (steps S104 to S106).

As described above, since the set operation is always performed before the write operation, the actual write operation can be always started with a uniform resistance value. Since the write operation is influenced by the resistance before the write operation, when such a method is adopted, the resistance by the write operation under a changed condition after the verify operation can obtain a desired value.

In this embodiment, the case where the data "1" is written has been described. In the case where the data "0" is written, only the set operation is performed, and the phase change material is crystallized so as to reduce the resistance is. In the case where the data "2" is written, the voltage Vreset higher than the voltage V1 is applied instead of V1, and the phase change material is completely melted and transformed into an amorphous state (complete reset operation) to as to increase the resistance.

In this embodiment, the case where the set operation is always performed before write operation has been described. However, the reset operation (application of the voltage Vreset) may be performed instead of the set operation (application of the voltage Vset) before the write operation. In this case, the actual write operation is performed by the set operation. As a result of the verify operation, when the resistance value is larger than the desired value, the reset operation is performed again. Thereafter, the write operation is performed after the set voltage is increased (third voltage), and a crystalline volume is increased so as to reduce the resistance value. Further, when the resistance value is smaller than a desired value, after the reset operation is performed again, the write operation is performed (third voltage) after the set voltage is reduced, and the crystalline volume is reduced so as to increase the resistance value.

Also, instead of the increase of the voltage, the time for which the voltage is applied may be lengthened, and instead of the reduction of the voltage, the time for which the voltage is applied may be shortened. More specifically, as a result of the verify operation, when the resistance value is larger than a desired value, after the reset operation is performed again, the write operation is performed after the set time is lengthened (second time). By doing so, the crystalline volume is increased so as to reduce the resistance value. Further, when the resistance value is smaller than the desired value, after the reset operation is performed again, the write operation is performed after the set time is shortened (second time). By doing so, the crystalline volume is reduced so as to increase the resistance value.

In this embodiment, the multi-bit storage has been described. However, the present invention can be applied also to a binary storage memory. In the case of the binary storage, margins for the resistance values of respective pieces of information are large in comparison to the multi-bit storage. However, as a result of the verify operation, the resistance cannot obtain a desired value in some cases.

(Power Supply Circuit Method)

Figure 5:
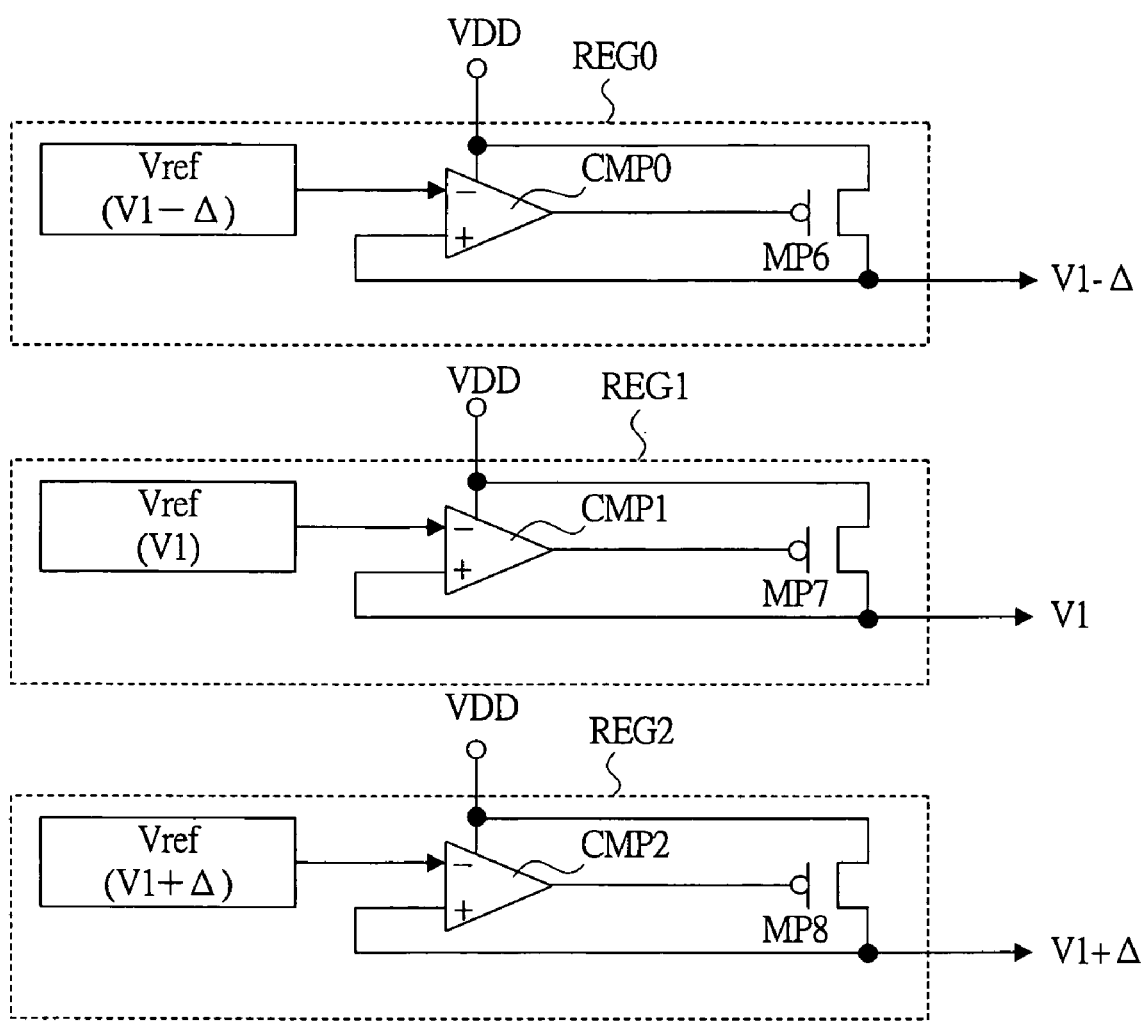
FIG. 5 is a circuit diagram illustrating a configuration of a power supply circuit to be used in the semiconductor device shown in FIG. 2.

A power supply circuit of a voltage to be supplied to the write amplifier circuit WA and the pre-charge circuit for read operation PCR will be described below with reference to FIG. 5. In this embodiment, five voltages of Vset, V1−Δ, V1, V1+Δ and Vreset are used as the write voltage, and a voltage Vr is used as the voltage for read operation. The respective voltages are generated by a circuit to generate the higher voltage and a regulator circuit. FIG. 5 shows a power supply circuit REG for the voltages V1−Δ, V1 and V1+Δ as one example. The power supply circuit that generates the voltage V1−Δ is REG0, the power supply circuit that generates the voltage V1 is REG1, and the power supply circuit that generates the voltage V1+Δ is REG2. The respective power supply circuits REG have the same configuration, and for example, the power supply circuit REG1 is composed of a reference voltage generating circuit Vref (V1), a comparison circuit CMP1 and a p channel MOS transistor MP7. The comparison circuit CMP1 compares a reference voltage Vref (V1) with an output voltage V1, and controls a voltage of a gate electrode of the p channel MOS transistor MP7 in accordance with the comparison result, so as to equalize the output voltage V1 with a desired reference voltage. The generated voltage V1 is supplied to the write amplifier circuit WA in the memory array.

(Multi-bit Read Method)

Figure 6:
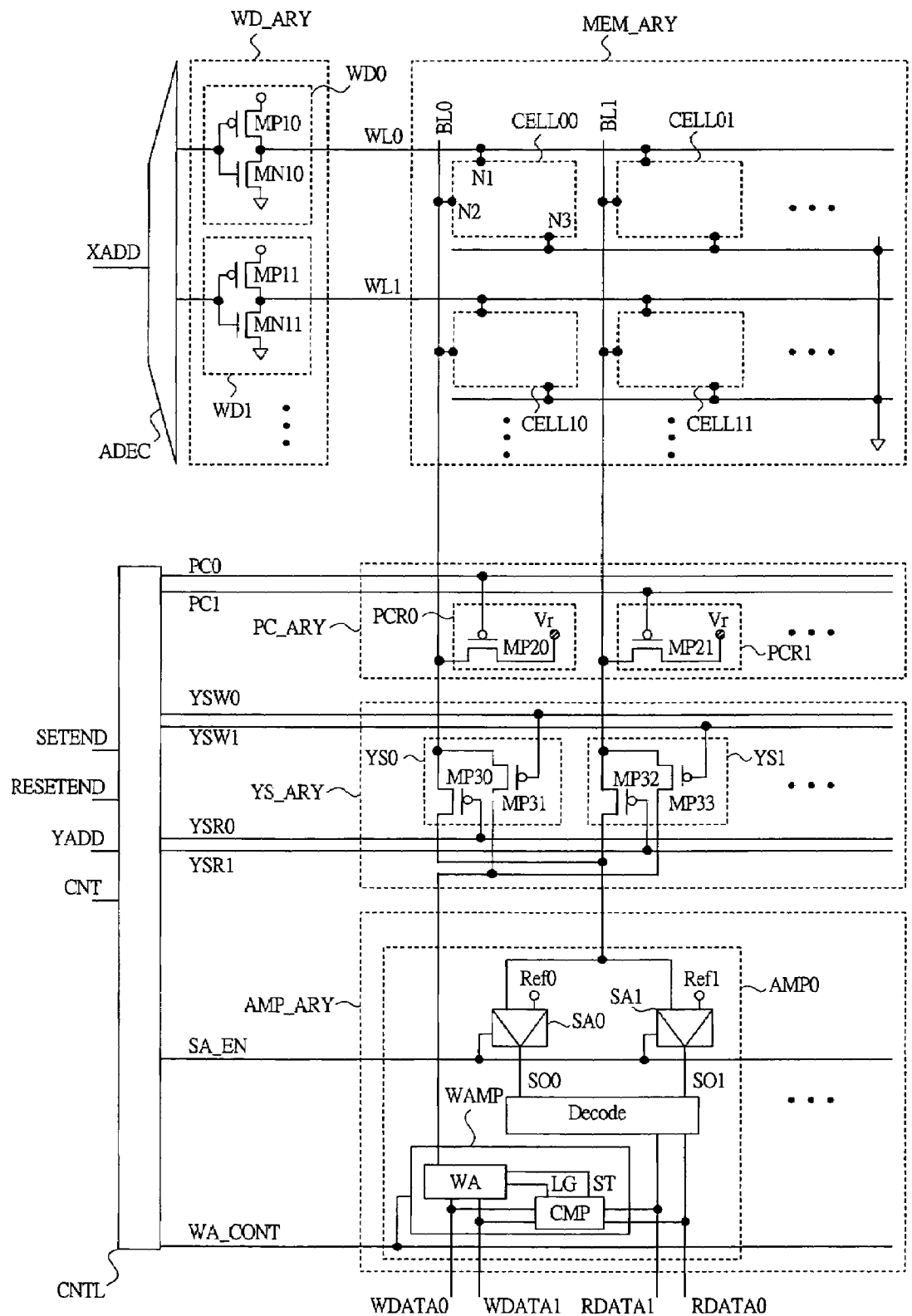
FIG. 6 is a circuit diagram illustrating another embodiment of the semiconductor device shown in FIG. 2.

A multi-bit read method will be described below with reference to FIG. 6. FIG. 6 illustrates a detail of the amplifier array AMP_ARY of the semiconductor device shown in FIG. 2. In the amplifier array AMP_ARY, a plurality of amplifier circuits AMP are arranged. The amplifier circuit AMP is composed of sense amplifier circuits SA0 and SA1, a decoder Decode, a write circuit WAMP and the like. The write circuit WAMP is composed of a write amplifier circuit WA and a comparison circuit CMP. The reference voltage Ref0 is inputted into the sense amplifier SA0, and a potential difference between the reference voltage Ref0 and the bit line BL is amplified by the sense amplifier activation signal SA_EN. The reference voltage Ref1 is inputted into the sense amplifier circuit SA1, and a potential difference between the reference voltage Ref1 and the bit line BL is amplified by the sense amplifier activation signal SA_EN. Data SO0 and SO1 read by the sense amplifier circuits SA0 and SA1 are decoded by the decoder Decode and are outputted to the data buses RDATA0 and RDATA1. In this embodiment, a trinary value is written. At the time of the data "0", 'L' is outputted to the data buses RDATA0 and RDATA1. At the time of the data "1", 'H' is outputted to the data bus RDATA0 and 'L' is outputted to RDATA1. At the time of the data "2", 'L' is outputted to the data bus RDATA0, and 'H' is outputted to the RDATA1. The data buses for write operation WDATA0 and WDATA1 are similarly used. The write data of the data buses WDATA0 and WDATA1 are compared with the read data of the data buses RDATA0 and RDATA1 in a comparison circuit CMP, and the write amplifier circuit WA is controlled by signals LG and ST in accordance with this comparison result. Further, the control signal WA_CONT is also a signal for controlling the write amplifier circuit WA.

Figure 7:
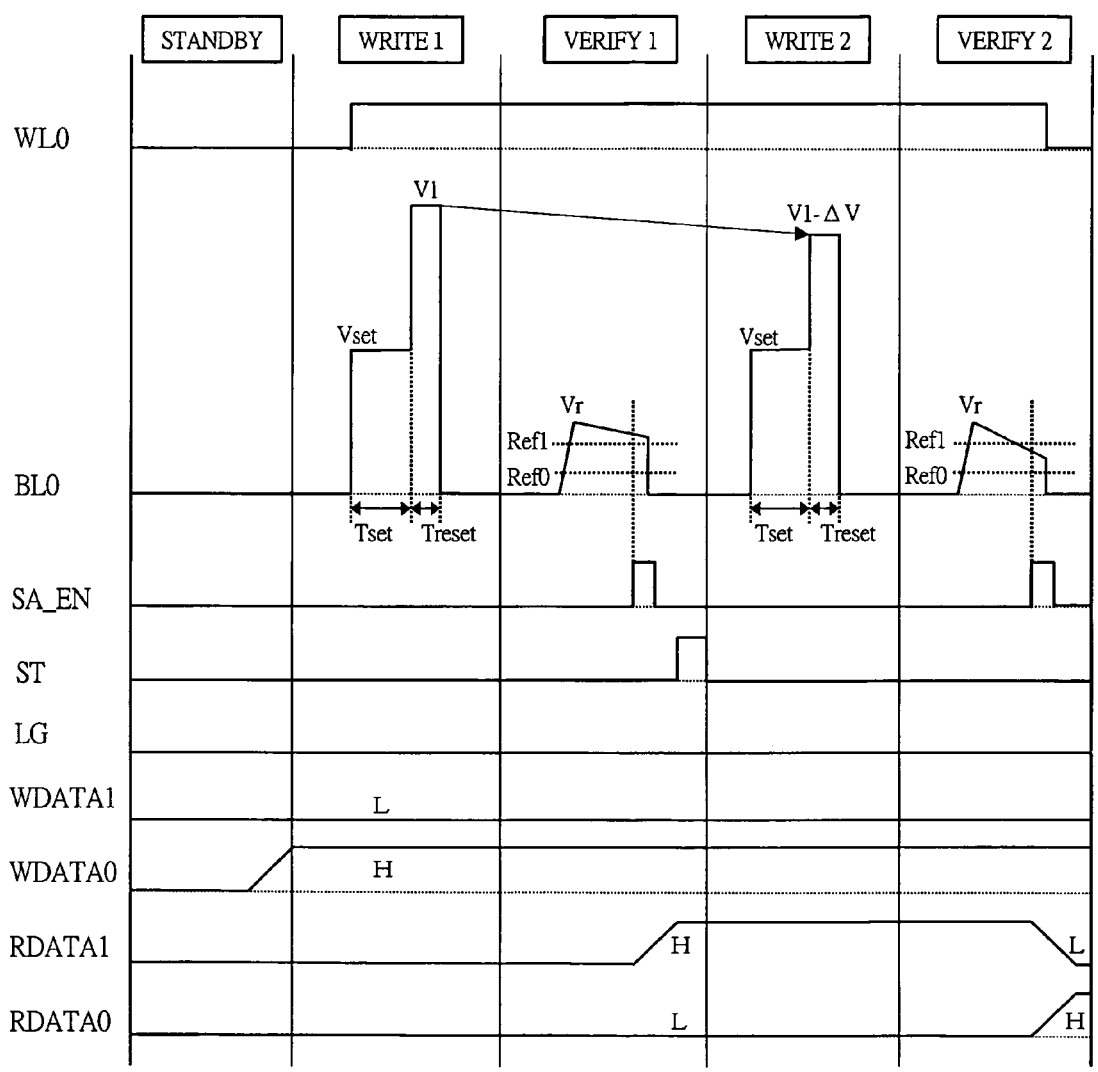
FIG. 7 is a waveform chart illustrating an operation of the semiconductor device shown in FIG. 6.

The operation will be described in detail below with reference to FIG. 7. FIG. 7 is a waveform chart illustrating the operation of the semiconductor device shown in FIG. 6. The waveform chart of FIG. 7 corresponds to the waveform chart of FIG. 4, but only the voltage of the bit line BVL0 is enlarged for clear viewing. The write data is "1", and 'H' is inputted into the data bus WDATA0 and 'L' is inputted into WDATA1. The write operation WRITE1 is the same operation as described with reference to FIG. 4. In the verify operation VERIFY1, the pre-charge control signal PC0 is converted from 'H' to 'L' and the bit line BL is precharged to the voltage for read operation Vr. Thereafter, the control signal PC0 is deactivated from 'L' to 'H', and an electric current is allowed to flow from the bit line BL0 to the ground potential by the memory cell CELL00. The voltage of the bit line is transmitted to the sense amplifier circuits SA0 and SA1 by activating the control signal YSR0. In the sense amplifier circuit SA0, the reference voltage Ref0 is compared with the voltage of the bit line BL0. When the voltage of the bit line BL0 is higher than the reference voltage Ref0, 'H' is outputted to the signal SO0, and when it is lower than the reference voltage Ref0, 'L' is outputted to the signal SO0. In the sense amplifier circuit SA1, the reference voltage Ref1 is compared with the voltage of the bit line BL0. When the voltage of the bit line BL0 is higher than the reference voltage Ref1, 'H' is outputted to the signal SO1, and when it is lower than the reference voltage Ref1, 'L' is outputted to the signal SO1. In this embodiment, for example, Vr is 0.5 V, Ref0 is 0.15 V, and Ref1 is 0.35 V. In FIG. 7, in the verify operation VERIFY1, the resistance value of the phase change material is high, and the electric potential of the bit line BL0 is not much reduced. Therefore, both SO0 and SO1 become 'H'. In this case, 'L' is outputted to the data bus RDATA0 and 'H' is outputted to the data bus RDATA1.

'H' is inputted into the data bus WDATA0 and 'L' is inputted into WDATA1, 'L' is outputted to the data bus RDATA0 and 'H' is outputted to RDATA1. These data are compared in the comparison circuit CMP. As a result of the comparison, since the written resistance value is larger than a target value, the write operation WRITE2 is performed again. Since the resistance value is larger than the target value, the control signal ST becomes 'H'. The voltage V1−Δ which is lower than that in WRITE1 is applied to the bit line BL0 and then the write operation is performed again. When the resistance value is smaller than the target value, the control signal LG becomes 'H', and the voltage V1+Δ which is higher than that in WRITE1 is applied to the bit line BL0 and then the write operation is performed again.

At the verify operation VERIFY2, similar to VERIFY1, the pre-charge control signal PC0 is converted from 'H' into 'L' and the bit line BL is pre-charged to the voltage for read operation Vr. Thereafter, the control signal PC0 is deactivated from 'L' to 'H', and the electric current is allowed to flow from the bit line BL0 to the ground potential by the memory cell CELL00. The voltage of the bit line BL0 is transmitted to the sense amplifier circuits SA0 and SA1 by activating the control signal YSR0. In FIG. 7, at VERIFY2, the resistance value of the phase change material is smaller than the previous value, and the electric potential of the bit line BL0 becomes lower than Ref1. At this time, when the sense amplifier circuits SA0 and SA1 are activated, SO0 becomes 'H', and SO1 becomes 'L'. In this case, 'H' is outputted to the data bus RDATA0 and 'L' is outputted to RDATA1.

'H' is inputted into the data bus WDATA0 and 'L' is inputted into WDATA1, and 'H' is outputted to the data bus RDATA0 and 'L' is outputted to RDATA1. These data are compared in the comparison circuit CMP. As a result of the comparison, since the written value matches with the value to be written, the write operation is ended.

(Multi-Bit Write Method Which Changes the Falling Speed of Pulse)

When the reset operation is performed in the phase change memory, the element melted by increasing the temperature and then rapidly cooled so that the storage element is transformed into an amorphous state. When the melted element is slowly cooled, for example, in 1 microsecond, the cell is transformed into an amorphous state but is crystallized. Therefore, by changing the cooling speed, a mix ratio of the amorphous state and the crystalline state is changed, and as a result, the resistance value of the storage element can be changed. In the above-described embodiment, the voltage to be applied to the phase change material is changed at the time of writing so as to change the resistance value. In this embodiment, however, the case where the cooling speed after melting is changed so as to change the value of the resistance to be written will be described. In order to change the cooling speed after reset, a fall speed of the reset pulse is changed.

Figure 8:
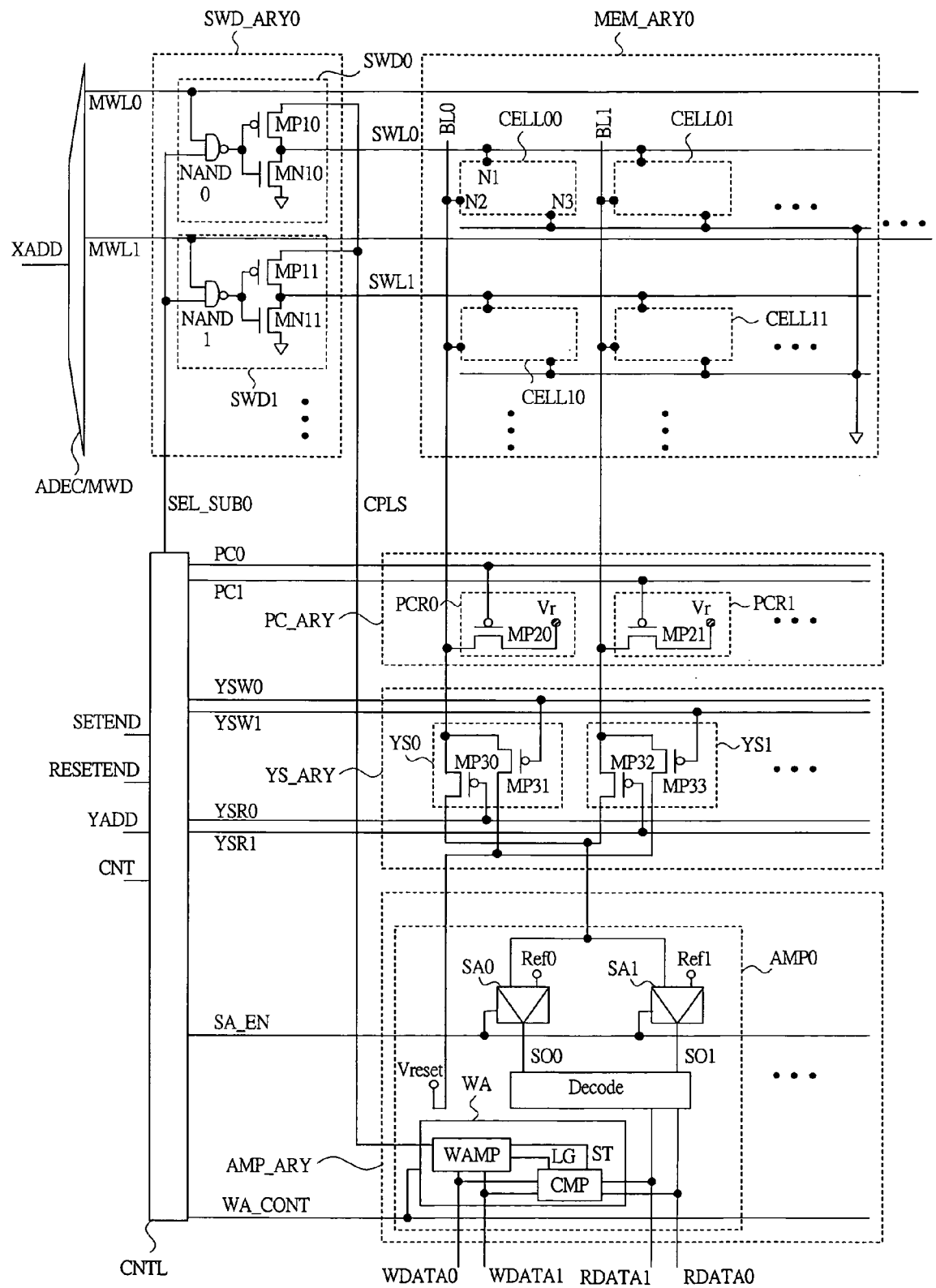
FIG. 8 is a circuit diagram illustrating another embodiment of the semiconductor device shown in FIG. 2.

FIG. 8 is a circuit diagram illustrating the semiconductor device according to this embodiment. Only the components which are different from those of FIG. 6 will be described below. In the configuration shown in FIG. 8, the word lines are hierarchized into main word lines MWL and sub-word lines SWL.

A decoder/main word driver ADEC/MWD receives an address XADD and selects a main word line MWL. Sub-word driver arrays SWD_ARY and memory arrays MEMORY are alternately arranged in a line. FIG. 8 illustrates only the sub-word driver array SWD_ARY0 and the memory array MEM_ARY0. In the sub-word driver array SWD_ARY0, a plurality of sub-word drivers SWD are arranged in a line. The sub-word driver SWD0 is composed of a p channel MOS transistor MP10, an n channel MOS transistor MN10 and a NAND circuit NAND0. The sub-word driver SWD0 is selected by the main word line WL0 and a sub-array selection signal SEL_SUB0 so as to activate the sub-word line SWL0. A source electrode of the p channel MOS transistor MP of the sub-word driver SWD is connected to a signal line CPLS from a write circuit WAMP. Also, the bit line BL is connected to the power supply line Vreset for reset operation via the column selection circuit YS.

Figure 9:
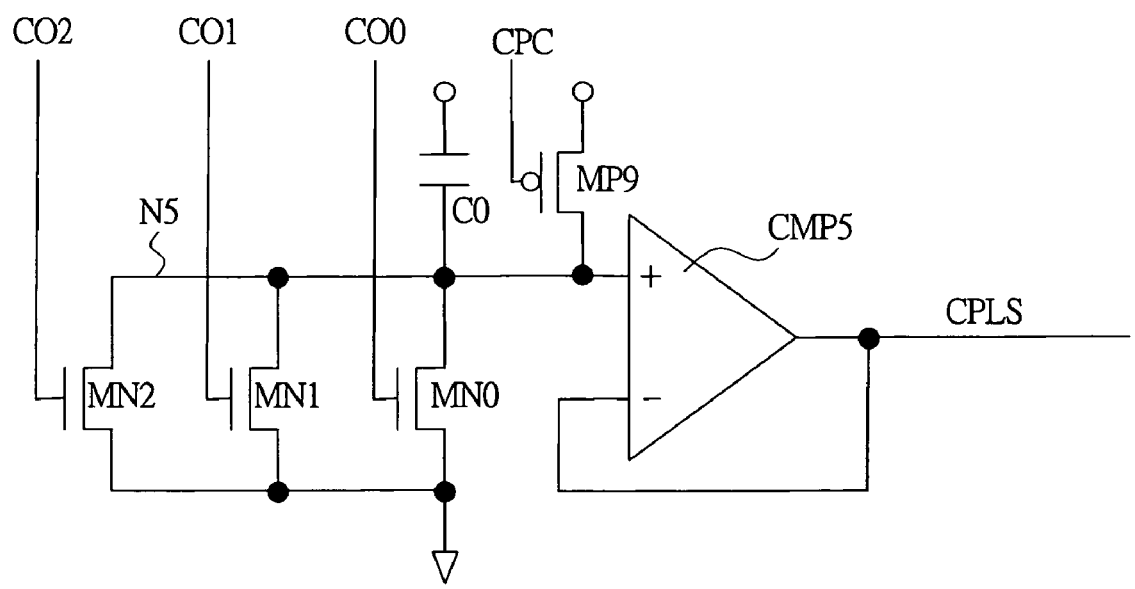
FIG. 9 is a circuit diagram illustrating a configuration of a circuit to be used in the semiconductor device shown in FIG. 8.

FIG. 9 is a detailed diagram illustrating a circuit that generates the signal CPLS. This circuit is located in the write circuit WAMP and controls the fall speed of the word line. This circuit is composed of n channel MOS transistors MN2, MN1 and MN0, a comparison circuit CMP5, a capacitor C0 and a p channel MOS transistor for pre-charge MP9. The capacitor C0 is connected to a node N5, and the p channel MOS transistor MP9 is a circuit that pre-charges the node N5 by means of a control signal CPC. Further, drains of the n channel MOS transistors MN2, MN1 and MN0 are connected to a node N5 and are controlled by signals CO0, CO1 and CO2 connected to their gates, respectively.

Figure 10:
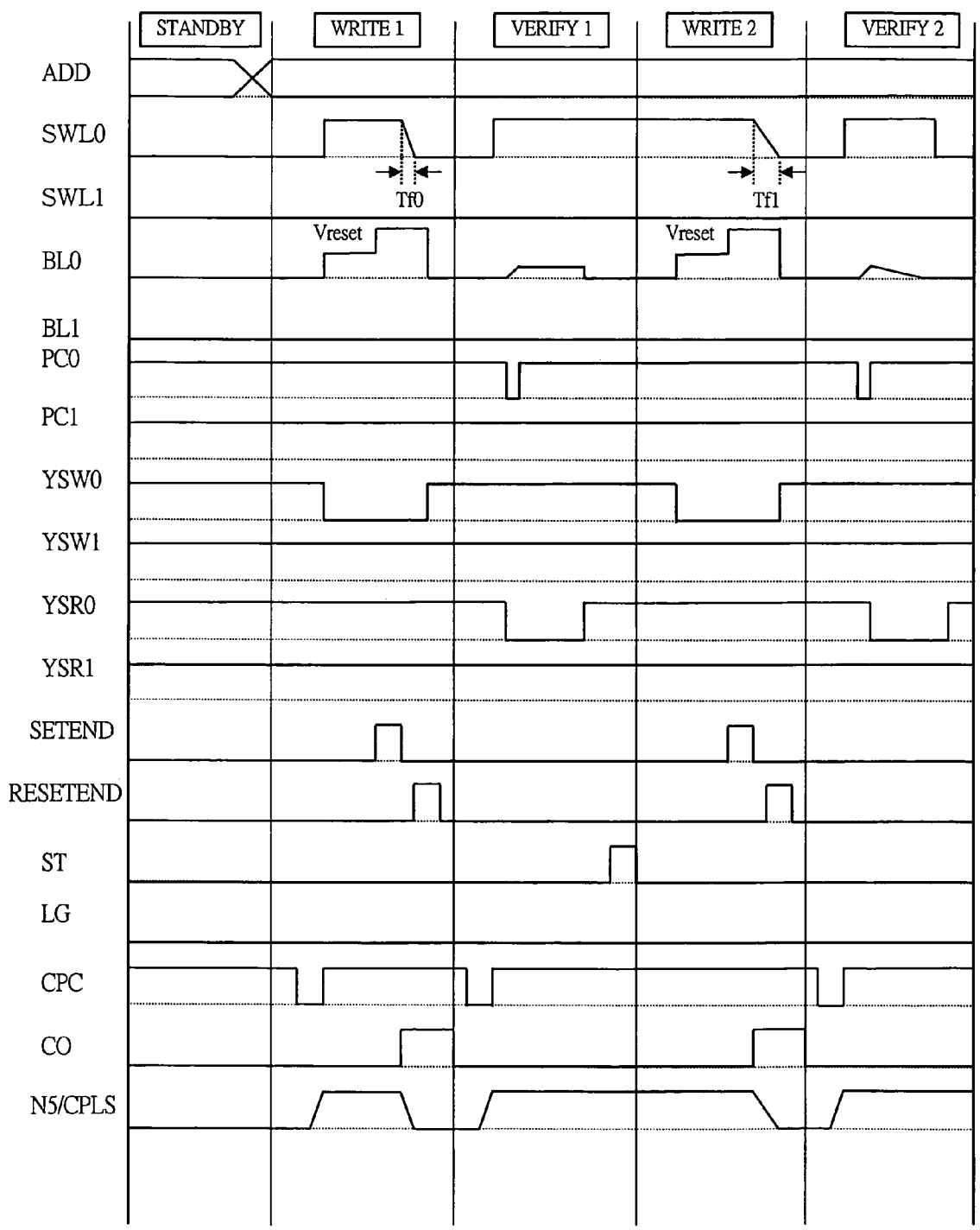
FIG. 10 is a waveform chart illustrating an operation of the semiconductor device shown in FIG. 8.

The operation of the circuit shown in FIG. 8 will be described below with reference to FIG. 10. Since the basic operation is the same as those explained with reference to FIG. 4 and FIG. 7, only different part will be described. In FIG. 10, at the write operation WRITE1, the reset voltage Vreset is set as the electric potential of the bit line BL0 after the set operation, and after the time Treset passes, the sub-word lines SWL are turned OFF over a time Tf0 (first time). As a result, the electric potential of the bit line BL0 also becomes the ground potential in the time Tf0. The time Tf0 is previously set so that the amorphous state and the crystalline state coexist and thus the desired resistance is obtained when the phase change material is melted and then solidified. When the time Tf0 is short, since there is not enough time for crystallization, the resistance becomes high. On the other hand, when the time Tf0 is long, the phase change material is crystallized and the resistance becomes low. In this embodiment, since the data "1" (100 kΩ to 1 MΩ) is written, the time Tf0 is, for example, about 100 ns. In order to control the fall time of the sub-word line SWL, the circuit in FIG. 9 is used.

In the circuit of FIG. 9, before the sub-word lines SWL are set to 'H', the signal CPC is set to 'L' so that the node N5 is pre-charged. By doing so, CPLS as the power supply of the sub-word driver SWD becomes the power supply potential. Thereafter, by changing CO from 'L' into 'H', the charge of N5 is drawn. Since the gate widths of the n channel MOS transistors MN0, MN1 and MN2 are different from each other, a current quantity changes depending on the selection of the transistors, and thus the fall time of the node N5 can be changed in accordance with a relationship with the capacitor C0. The electric potential of the node N5 is transmitted to CPLS by the comparison circuit CMP5, and the fall time of the sub-word lines SWL is controlled.

Next, when the read operation is performed by the verify operation VERIFY1 and the resistance written into the storage element is higher than a target value, the write operation WRITE2 is performed again. The reset voltage Vreset is set to the electric potential of the bit line BL0 after the set operation, and after the time Treset passes, the sub-word line SWL0 is turned off over the time Tf1 (second time). As a result, the electric potential of the storage element also becomes the ground potential in the time Tf1. The time Tf1 is longer than the time Tf0, and as a result, a percentage of the crystal increases further than that at the time of the write operation WRITE1 when the phase change material is melted and then solidified, and thus, the resistance value of the storage element is reduced.

When the resistance value of the storage element is smaller than the target value, the fall time Tf is shortened, and the write operation is performed again. Further, in this embodiment, the fall time of the word lines is controlled, but the fall time of the bit lines BL may be directly controlled. Further, the multi-bit operation becomes easier when combined with a method of performing the multi-bit operation by changing the write voltage.

Figure 11:
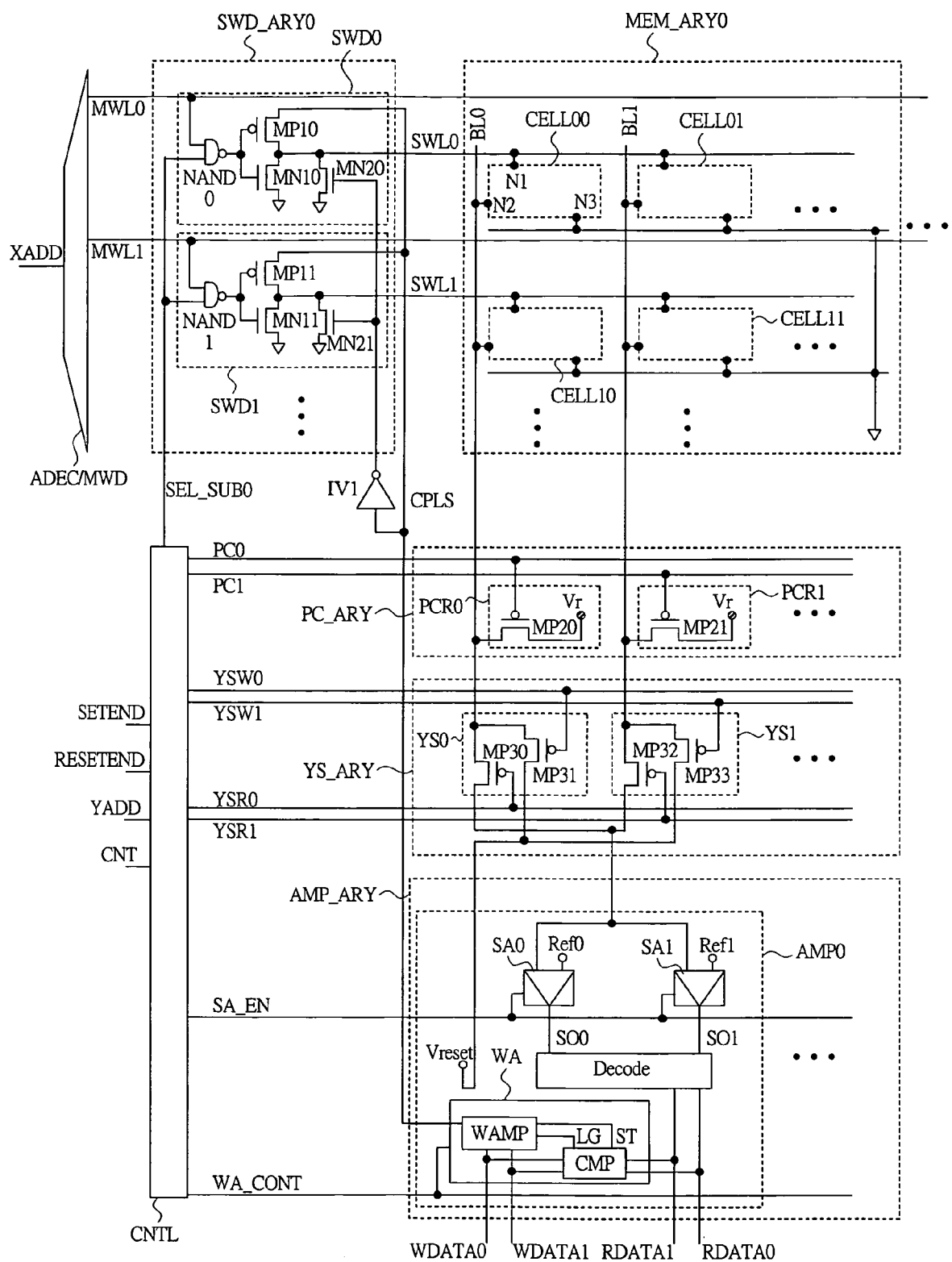
FIG. 11 is a circuit diagram illustrating another embodiment of the semiconductor device shown in FIG. 8.

In the case of the circuit shown in FIG. 8, since the signal CPLS1 reduces the electric potentials of the sub-word lines SWL0 and SWL1 via the p channel MOS transistors MP10 and MP11, there is the possibility that the sub-word lines WL0 and WL1 do not become completely 0 V. Therefore, as shown in FIG. 11, the n channel MOS transistors MN20 and MN21 and an inverter IV are additionally provided, and the transistors MN20 and MN21 are connected to the sub-word lines SWL0 and SWL1, respectively. With this configuration, when certain time passes after the voltage of the sub-word lines SWL begins to fall, an output from the inverter IV1 is inverted, and the electric potentials of the sub-word lines SWL can be rapidly reduced by the n channel MOS transistors MN20 and MN21. For this reason, the sub-word lines SWL can be reduced to 0 V completely.

(Read Method)

As the resistance value becomes larger, it becomes more difficult that the electric current flows and a heat is generated, and thus the resistance value hardly changes. For this reason, when the multi-bit operation is performed, the case where the large resistance value is divided is more stable than the case where the small resistance value is divided. When the large resistance value is divided, however, the electric current hardly flows and it is difficult to detect its difference. For example, in the case where 0.5 V is applied to the bit line BL, only the electric current of 50 nA flows when the resistance value of the cell is 10 MΩ, and only the electric current of 5 nA flows when the resistance value is 100 MΩ. In both the cases, the electric potentials of the bit lines BL hardly charge. For this reason, it is difficult to discriminate the resistance value 10 MΩ from the resistance value 100 MΩ. Therefore, a method of discriminating the resistance of the phase change material of 10 MΩ from 100 MΩ is devised.

Figure 12:
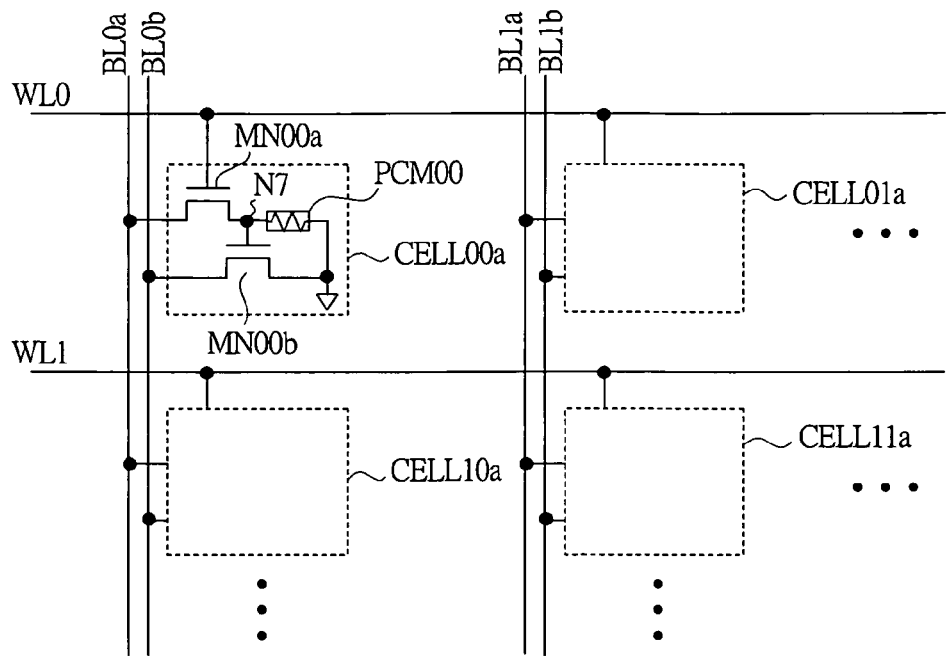
FIG. 12 is a circuit diagram illustrating another embodiment of the memory array in FIG. 2.
Figure 13:
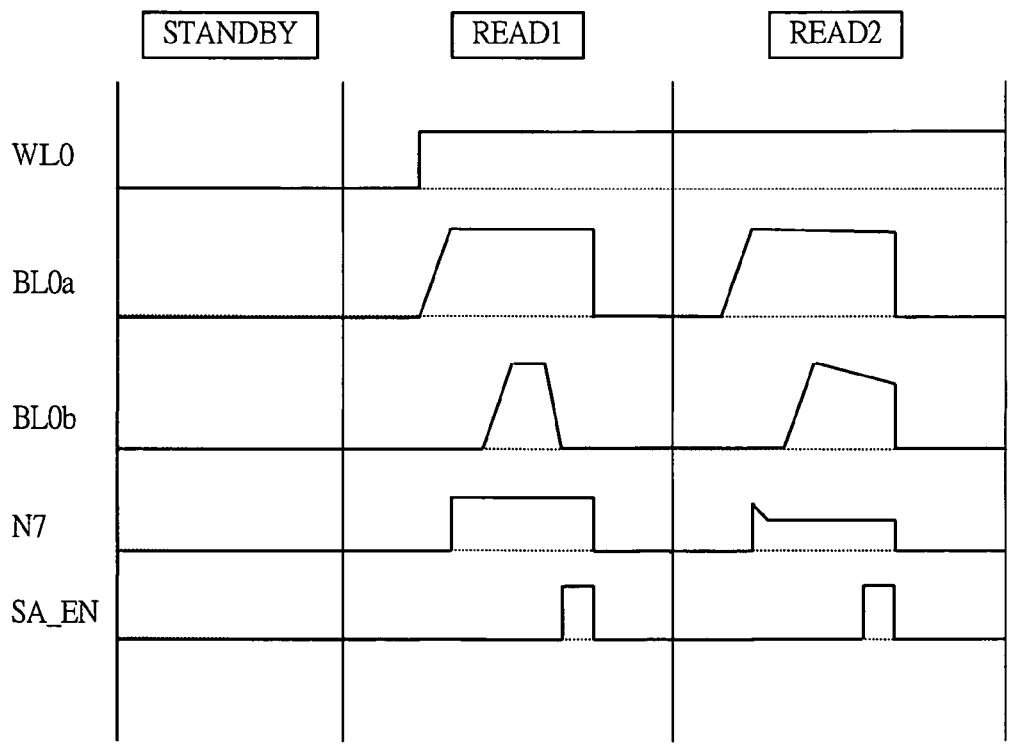
FIG. 13 is a waveform chart illustrating an operation of the memory array shown in FIG. 12.

FIG. 12 is a configuration diagram illustrating the memory cell array according to this embodiment, and FIG. 13 is an operation diagram thereof. This memory cell array is composed of a plurality of word lines WL and a plurality of bit lines BLa and BLb, and memory cells CELLa are connected to intersection points between the word lines WL and the bit lines BLa and BLb, respectively. Each memory cell CELLa is, as illustrated as the memory cell CELL00a, composed of an n channel MOS transistor MN00a, an n channel MOS transistor MN00b and PCM00 as a storage element. The storage element PCM00 is, for example, an element which is called as a phase change material. A gate electrode of the n channel MOS transistor MN00a is connected to the word line WL0, its drain electrode is connected to the bit line BL0a, and its source electrode is connected to a node N7. A gate electrode of the n channel MOS transistor MN00b is connected to the node N7, a drain electrode thereof is connected to the bit line BL0b, and a source electrode thereof is connected to the ground potential. The storage element (phase change material) PCM00 is connected between the node N7 and the ground potential. Though not shown, the word line WL is connected to a word driver, the bit line BLa is connected to a write circuit and a read circuit, and the bit line BLb is connected to the read circuit. The write operation is performed by using the bit line BLa in the same manner as that described above.

The read operation will be described with reference to FIG. 13.

In FIG. 13, the read operation READ1 is the case where the element resistance of about 100 MΩ is read, and the read operation READ2 is the case where the element resistance of about 10 MΩ is read. The bit lines BLa and BLb are precharged, the word line WL0 is activated, and only the bit line BLa is floated. Since both the cell resistances (about 100 MΩ and about 10 MΩ, are very high, the electric potential of the bit line BL0a are almost equal in the read operations READ1 and READ2. However, the electric potential of the node N7 is not equal. When the electric potential of the node N7 is stabilized, the bit line BLb is floated. The electric potential of the node N7 in READ1 (about 100 MΩ) is higher than the electric potential of the node N7 in READ2 (about 10 MΩ). For this reason, BL0b is discharged more quickly in READ1. When a certain potential difference is generated, the sense amplifier SA_EN is activated. In this manner, the resistance value of the storage element PCM00 can be determined by the combination of the amplification results of the bit line BL0a and the bit line BL0b. When the resistance value is small, since the electric potential of the bit line BL0a largely differ, detection is easy.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the electric potentials in the embodiments can obtain arbitrary values as long as a magnitude relationship between the electric potentials is satisfied.

The present invention can be effectively applied to non-volatile memories, on-chip memories which are mounted on a system LSI, and others.

What is claimed is:

1. A semiconductor device, comprising:
   a memory array including a plurality of word lines which extend in a first direction, a plurality of bit lines which extend in a second direction and which intersect said word lines, and a plurality of memory cells which are disposed at respective intersection points of said word lines and said bit lines and which are connected to said word lines and said bit lines associated with said respective intersection points;
   a plurality of word drivers, each said word driver being connected to a respective one of said plurality of word lines;
   a plurality of read circuits, each said read circuit being connected to a respective one of said plurality of bit lines; and
   a plurality of write circuits, each said write circuit being connected to a respective one of said plurality of bit lines,
   wherein each said memory cell has a storage element which stores data therein and a field-effect transistor which is connected to said storage element, and
   said semiconductor device further comprises:
   a circuit portion which applies a first voltage to said storage element and then applies a second voltage to said storage element for a first time period to perform a write operation, which checks a value written into said storage element, and, which, if the value of said storage element is not within a desired range, applies said first voltage to said storage element and then applies a third voltage, different from said second voltage, to said storage element for said first time period to perform the write operation again,
   wherein the first voltage is smaller than the second and third voltages,
   wherein a resistance value of said storage element that is supplied with the second voltage is higher than a resistance value of said storage element that is supplied with the first voltage, and
   wherein a resistance value of said storage element that is supplied with the third voltage is higher than a resistance value of said storage element that is supplied with the first voltage.

2. The semiconductor device according to claim 1, wherein said storage element is comprised of a phase change material, and data written into said storage element is stored as a resistance value of said storage element.

3. The semiconductor device according to claim 2,
   wherein said first voltage is lower than said second voltage, and
   when the resistance value of said storage element is smaller than a desired value, said third voltage is higher than said second voltage, and when the resistance value of said storage element is larger than the desired value, said third voltage is lower than said second voltage.

4. The semiconductor device according to claim 1,
   wherein each of said plurality of memory cells includes:
   the storage element;
   a first field-effect transistor in which a source electrode thereof is connected to said storage element, a drain electrode thereof is connected to the first bit line and a gate electrode thereof is connected to said word line; and
   a second field-effect transistor in which a source electrode thereof is connected to a ground potential, a drain electrode thereof is connected to the second bit line and a gate electrode thereof is connected to the source electrode of said first field-effect transistor.

* * * * *